United States Patent [19]
Knuth et al.

[11] Patent Number: 5,588,046
[45] Date of Patent: Dec. 24, 1996

[54] DIGITAL TELEPHONE ANSWERING DEVICE AND METHOD OF TESTING MESSAGE STORAGE MEMORY THEREIN

[75] Inventors: Stephen B. Knuth, Mission Viejo; Sanford M. Brown, III, Cardiff by the Sea; Mark J. Karnowski, Westminster, all of Calif.

[73] Assignee: Casio PhoneMate, Inc., Torrance, Calif.

[21] Appl. No.: 546,810

[22] Filed: Oct. 23, 1995

[51] Int. Cl.$^6$ .................. G11C 11/34; G11C 29/00; G06F 11/00; H04M 1/64

[52] U.S. Cl. .................. 379/67; 379/88; 379/89; 371/21.1; 371/24; 371/25.1; 371/10.2; 365/201; 365/200

[58] Field of Search .................. 379/67, 88, 89; 371/10.2, 21.1, 24, 25.1, 27; 365/201, 45, 200

[56] References Cited

U.S. PATENT DOCUMENTS

| | | | |
|---|---|---|---|
| 4,061,908 | 12/1977 | de Jonge et al. | 235/302.3 |
| 4,066,880 | 1/1978 | Salley | 235/302.3 |
| 4,195,770 | 4/1980 | Benton et al. | 371/21 |
| 4,715,034 | 12/1987 | Jacobson | 371/21 |
| 4,873,705 | 10/1989 | Johnson | 371/21.1 |
| 5,157,664 | 10/1992 | Waite | 371/10.2 |
| 5,185,722 | 2/1993 | Ota et al. | 365/201 |
| 5,241,501 | 8/1993 | Tanaka | 365/201 |
| 5,446,741 | 8/1995 | Boldt et al. | 371/21.1 |
| 5,497,376 | 3/1996 | Kopp | 371/10.2 |

OTHER PUBLICATIONS

AT&T Digital Answering System Speakerphone 1545 (Owner's Manual).
Panasonic Integrated Telephone Answering System KX-T2880; Model No. KX-T2880-W.

*Primary Examiner*—Krista M. Zele
*Assistant Examiner*—Parag Dharia
*Attorney, Agent, or Firm*—Frishauf, Holtz, Goodman, Langer & Chick

[57] ABSTRACT

A telephone answering device includes a digital recording and playback circuit for digitizing, recording and playing back a message from a telephone line; an audio random access memory for storing messages digitized by the digital recording and playback circuit; and a control unit, coupled to the audio random access memory. The control unit initially performs a test of only part of the memory in an amount sufficient to enable a user to perform predetermined basic functions, immediately after power is supplied to the device, without testing a remainder of the memory. Thereafter, a continuous repetitive series of tests of at least the remainder of the memory is performed while waiting for user input, to determine failed sections of the memory that are to be avoided during recording of a message. The failed sections of the memory, that are to be avoided during recording of a message after the determination, are marked. The user input is processed when it occurs, stopping performance of the continuous repetitive series of tests simultaneously with processing of the user input. The system returns to the step of performing the continuous repetitive series of tests after completion of the processing of the user input.

11 Claims, 6 Drawing Sheets

DIGITAL TELEPHONE ANSWERING DEVICE AND METHOD OF TESTING MESSAGE STORAGE MEMORY THEREIN

BACKGROUND OF THE INVENTION

This invention relates to telephone answering devices, and more particularly to a digital telephone answering device having an electronic memory for storing messages therein, and to a technique for testing the message storage memory.

One of the most recent advances in telephone answering device (TAD) technology is the use of random access memory (RAM) instead of magnetic tape for the storage of incoming and outgoing voice messages. Using digital rather than analog means for storing voice messages provides for a more reliable TAD due to more consistent audio quality, elimination of the problems inherent with moving mechanical parts and also elimination of problems caused by malfunction or breakage of the magnetic tape itself. Having messages stored in a RAM chip also allows the user to selectively access a specific message more quickly and easily than if the messages were stored on a cassette tape. Using a conventional analog TAD, the user must wait for the cassette tape to rewind or fast forward in order to hear a specific message, or the user must listen to all of his or her messages again just to replay one particular message.

One drawback to an "all digital" TAD is that the use of RAM is more expensive than the use of magnetic tape. In order to offset the additional cost of using RAM for message storage, it is common to use a less expensive audio random access memory (ARAM) chip in combination with a digital signal processor (DSP) chip. The DSP chip, when used for speech compression and decompression, allows for minimization of RAM use. An ARAM chip, by definition, contains defects, which is the reason for the lower cost. These defects make the chips unacceptable for digital applications in which data storage must be perfect, such as for use in computers, but acceptable for use in applications where a limited number of defects will not affect the quality or efficiency of the audio output. In order for an ARAM to be effective, the chip must be characterized and critical errors or defects mapped prior to use. This insures that information will not be stored in a section of the chip that contains defects that would affect the quality of the audible sound reproduced therefrom.

Many methods exist for testing digital memories and locating defects. All of these methods consume time in proportion to the rigorousness of the test routine and the size of the memory to be tested, which becomes considerable for RAMs of the size used in today's all digital TADs. Thus, the memory must be characterized or tested using a memory test algorithm before any recording can take place, which maps out any faults in the memory.

With digital telephone answering devices available today, the approach is to require an initialization process that takes place as soon as the user powers up the machine, that is, to immediately initiate the memory test algorithm upon power up. This initialization process is necessary for the characterization of the TAD's memory.

However, this results in a "dead time" for the user in which the unit will not respond to key closures or other actions initiated by the user until the characterization or test process is complete, that is, the TAD is non-responsive to all user input. This routine can continue for anywhere from thirty seconds to almost two minutes, as is the case in models such as Panasonic's KX-T2880 and AT&T's 1545. It is common for units to display a countdown timer during this period. Thus, while the memory test algorithm is running, the user faces a non-responsive unit, which can be inconvenient and frustrating for the user.

In order to minimize this effect, manufacturers often compromise the memory characterization or testing process in order to reduce the dead time, possibly resulting in undetected defects in the ARAM and could result in less than desirable performance of the device.

A traditional approach to the dilemma of speeding up memory characterization is to create more efficient test patterns and more efficient means of reading and writing these test patterns. Many times this requires specialized hardware in order to perform the tests. With this approach, there is also a danger of incomplete testing due to time limitations.

U.S. Pat. No. 4,195,770 to Benton et al describes a test generator for detecting functional failures of RAMs, using the traditional approach discussed above. Benton et al tests RAMs by writing patterns into the memory and reading out such patterns again so that they may be compared with the original pattern. Benton et al uses a predetermined number of generated test patterns in accordance with the bit organization of the RAM which is being tested, and continuously compares results during the test sequence to determine if the RAM is functionally good or bad. While this procedure saves time, it does not allow for complete testing of a RAM in a TAD, and does not address the problem of faults that may occur over the life of the RAM.

U.S. Pat. No. 4,066,880 to Salley describes a system for pre-testing all data bit locations and identifying faulty memory sections prior to the entry of any data. Salley recognizes the possibility that a chip which initially is not faulty, can become faulty sometime during its life. Salley continuously monitors the memory for faulty bit locations to overcome this potential problem. While Salley recognizes that the identification of faults in a RAM should take place during normal operation and should not disturb normal operation, Salley does nothing to speed up the testing for initial use.

U.S. Pat. No. 4,715,034 to Jacobson describes a probabilistic method of and system for fast functional testing of RAMs. Functional testing detects faults in the memory that cause it to function incorrectly. Jacobson teaches a method of identifying memory faults using a memory test algorithm that requires as short a testing time as possible while still asserting to be accurate. Jacobson improves efficiency by using a pseudo random method of testing but, as with Benton et al, the increase in testing speed is due to changes in the test pattern. As discussed above, the shorter testing time could result in incomplete testing and, therefore, faults that might prove fatal to the system would go undetected.

Another patent that teaches a method of and system for high-speed, high-accuracy functional testing of memories is U.S. Pat. No. 4,873,705 to Johnson. Johnson teaches an emulator-type test system that is permanently coupled to the bus structure of the unit under test. Johnson also uses a block move and compare method by which data from a range of memory addresses may be accessed, moved and compared. Johnson reduces the time it takes to test one pattern by taking advantage of hardware capabilities of the particular microprocessor that is performing the test. However, Johnson does not test for errors that can occur over time.

U.S. Pat. No. 4,061,908 to de Jonge et al describes yet another example of a method for improving memory testing efficiency by improving the test pattern. This method has the same drawbacks as the methods described above.

SUMMARY OF THE INVENTION

Thus, it is an object of the present invention to provide a digital telephone answering device and a method of testing message storage memory therein, which performs a "quick check" of RAM immediately after power on, so as to characterize or test just enough of the storage memory so that a user can perform certain basic functions immediately after power is supplied to the unit.

It is another object of the present invention to provide a telephone answering device and a method of testing message storage memory therein, which thereafter continuously executes the characterizing or testing task in a background mode where it is transparent to the user, without compromising the thoroughness of the characterization or testing of the memory, in order to minimize initialization dead time and to detect errors or defects that occur over time.

It is still another object of the present invention to provide a telephone answering device and a method of testing message storage memory therein, which does not limit the time for performing the memory characterization tests.

It is yet another object of the present invention to provide a telephone answering device and a method of testing message storage memory therein, which utilizes memory characterization or testing algorithms that can perform the required tests without inconveniencing the user or compromising the memory characterization or testing operation.

It is a further object of the present invention to provide a telephone answering device and a method of testing message storage memory therein, that performs memory characterization or testing in a background mode in order to allow the digital TAD to be responsive to key closures and other user manipulations, without exhibiting a delay.

It is a still further object of the present invention to provide a telephone answering device and a method of testing message storage memory therein, that permits recording by the user of an outgoing message (OGM) only after an initial portion of the memory has been characterized or tested during the aforementioned "quick check".

It is a yet further object of the present invention to provide a telephone answering device and a method of testing message storage memory therein, which uses the otherwise idle or quiescent time of the TAD to continuously and fully characterize or test the RAM thereof.

Specifically, with the present invention, only a small portion of good memory needs to be identified in order for the TAD to comply with many user actions, such as auto dial store, record outgoing message (OGM), set software operation modes, etc. It is not even necessary to characterize or test the RAM at all for such user actions as setting time, time check, off hook, speakerphone, etc. Using a fast running but abbreviated algorithm, a small portion of memory can be tested in only a fraction of the time required to characterize or test the entire RAM, thereby allowing the user to record an OGM or memo very shortly after power up. Thereafter, the software routine performs the testing of the entire RAM in a "background mode". In this way, the memory check process will be suspended whenever a user demand is placed upon the CPU. The background mode characterization will be run on a continuous basis, 24 hours a day, thus allowing for exhaustive testing without consequence to the user or affecting operation of the TAD. Running the test continuously, in the background mode, also allows for identification of critical faults that occur over time, well after initial power-up.

Thus, after a "quick check" of memory is performed and the greeting is recorded, there is an unlimited amount of time in which to perform a thorough test of the memory. The unit is sitting idle for much of the time so that it can continually run memory tests in the background. Therefore, the present invention improves the way the tests are performed, and not the test patterns themselves. Therefore, virtually any test pattern can be used and the technique of the present invention will enhance such a test pattern.

In accordance with an aspect of the present invention, a method for testing message storage memory in a digital telephone answering device, includes the steps of initially performing a test of only part of the memory in an amount sufficient to enable a user to perform predetermined basic functions, immediately after power is supplied to the device, without testing a remainder of the memory; thereafter performing a continuous repetitive series of tests of at least the remainder of the memory while waiting for user input, to determine failed sections of the memory that are to be avoided during recording of a message; marking the failed sections of the memory that are to be avoided during recording of a message after the determination; processing the user input when it occurs; stopping performance of the continuous repetitive series of tests simultaneously with processing of the user input; and returning to the step of performing the continuous repetitive series of tests after completion of the processing of the user input.

The initial performance of the test provides that the part of the memory that is tested is sufficient for the user to record an outgoing message.

In addition, a limited set of user inputs is processed during the initial performance of the test of the part of the memory.

Further, recording of an outgoing message during the initial performance of the test of the part of the memory, is disabled.

In accordance with another aspect of the present invention, a telephone answering device includes digital recording and playback means for digitizing, recording and playing back a message from a telephone line; memory means for storing messages digitized by the digital recording and playback means; and control means, coupled to the memory means, for initially performing a test of only part of the memory means in an amount sufficient to enable a user to perform predetermined basic functions, immediately after power is supplied to the device, without testing a remainder of the memory means, thereafter performing a continuous repetitive series of tests of at least the remainder of the memory means while waiting for user input, to determine failed sections of the memory means that are to be avoided during recording of a message, marking the failed sections of the memory means that are to be avoided during recording of a message after the determination, processing the user input when it occurs, stopping performance of the continuous repetitive series of tests simultaneously with processing of the user input, and returning to the step of performing the continuous repetitive series of tests after completion of the processing of the user input.

The memory means preferably includes an audio random access memory means, and the control means includes a digital signal processor/controller connected with the audio random access memory means.

DETAILED DESCRIPTION

Figure 1:
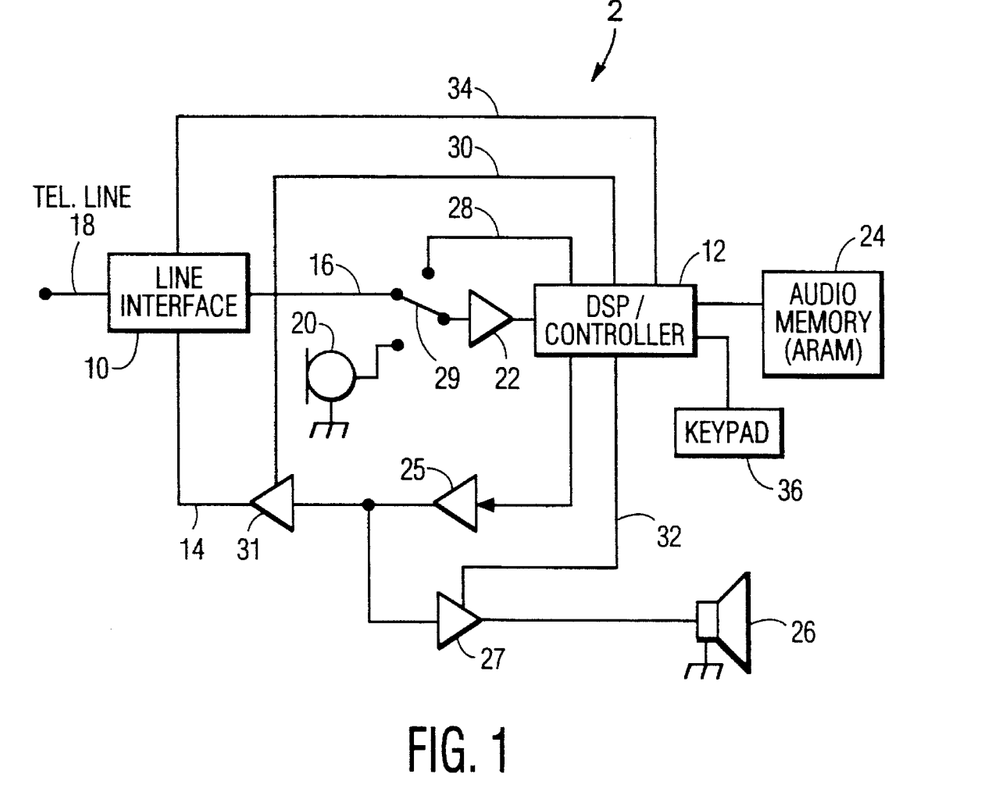
FIG. 1 is a generalized block diagram of a telephone answering device (TAD) in accordance with the present invention.

Referring to the drawings, and initially to FIG. 1 thereof, a telephone answering device (TAD) 2 according to the present invention includes a line interface circuit 10 having a ring detection circuit and a line seizure circuit which are controlled by a digital signal processor (DSP)/controller 12. Line interface circuit 10 also includes circuitry necessary to couple the transmitting audio path 14 and receiving audio path 16 of device 2 to a telephone line 18.

The signal from line interface circuit 10 or a local microphone 20 of TAD 2 passes through an automatic gain control amplifier 22 which presents an optimized analog signal to DSP/controller 12.

DSP/controller 12 quantizes or digitizes the optimized analog signal, compresses the digitized signal and sends the result to an audio random access memory (ARAM) 24 of TAD 2 for storage therein. DSP/controller 12 can also retrieve stored audio data from audio memory 24. When retrieved, the audio data is decompressed, converted back into an analog signal and fed to an amplifier 25 of TAD 2. This signal is then routed to line interface circuit 10, to a local loudspeaker 26, or to both.

Control of the audio path switching by signals along lines 28, 30 and 32, and the line seizure circuitry in line interface circuit 10, is provided by the DSP/controller 12. The signal along line 28 from DSP/controller 12 controls a switch 29 to select either telephone line receiving audio path 16 from line interface circuit 10 or the signal from microphone 20. The selected signal is then fed to amplifier 22. The signal along line 30 from DSP/controller 12 enables amplifier 31 to provide audio signals on line 14 to line interface circuit 10. The signal along line 32 from DSP/controller 12 enables amplifier 27 to provide audio signals to loudspeaker 26. The actions of DSP/controller 12 are determined by the ring detect signal along line 34 from line interface circuit 10, user input from a keypad 36, and instructions provided by software in the memory of DSP/controller 12.

Audio random access memory (ARAM) 24 is used for storing recorded messages and message directory information. The size and configuration of ARAM 24 can take any of several forms. This allows for the most appropriate approach to be fit in the circuit design.

Figure 4A:
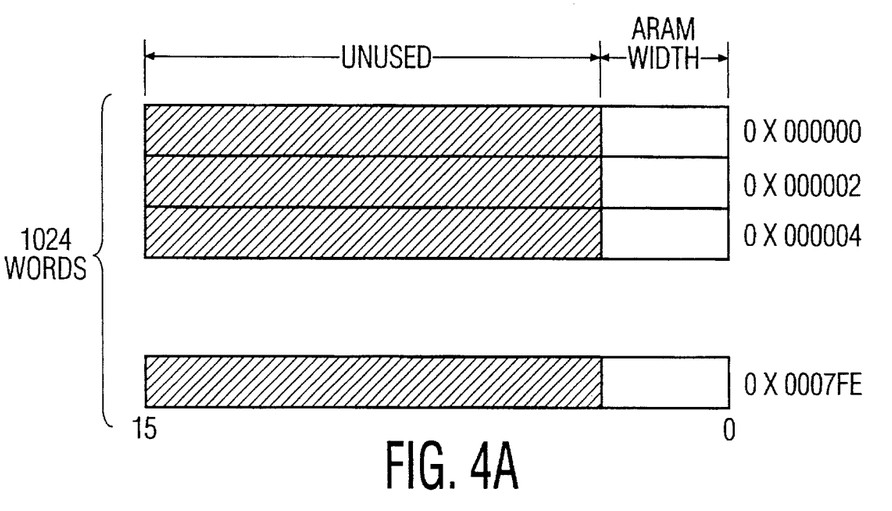
FIG. 4A shows a memory map of one row of the audio memory (ARAM) of the TAD of the present invention.
Figure 4B:
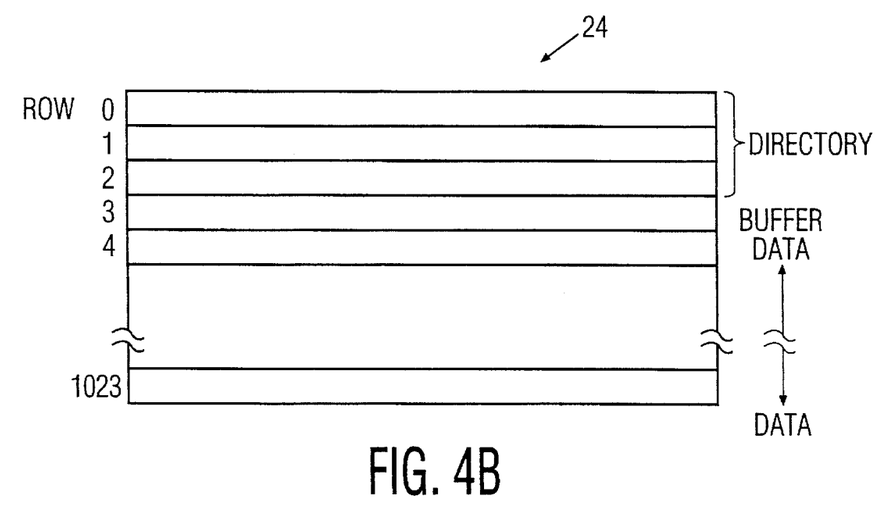
FIG. 4B shows the structure of the ARAM itself.

FIG. 4A shows a memory map of one row in ARAM 24 of the present invention and FIG. 4B depicts the structure of ARAM 24 itself. The present invention describes the use of a 4-megabit ARAM with 1,048,576 addresses by a 4-bit wide configuration. The 4-megabit ARAM 24 of the present invention is capable of storing more than 9 minutes of messages in a typical system using compression techniques that achieve an effective 7700 bits per second or better data rate. As shown in FIG. 4B, ARAM 24 is organized into 1024 rows. As shown in FIG. 4A, each row contains 1024 addresses and the 4-bits of ARAM 24 data are mapped to the four least significant bits of 16 bits (one word) of data at each address.

There must be four rows in ARAM 24 that have no defects. For the sake of convenience, these four "no defect" rows are shown at the beginning of ARAM 24. However, such four "no defect" rows, in fact, could be anywhere in ARAM 24 to avoid unnecessary restrictions on the ARAM 24 specification. These four "no defect" rows store directory information. The first two rows (1 Kbyte) of the four good rows form a row table that contains directory information describing the status of each row. The third row contains directory information describing the status of each message. The fourth row is used to temporarily store current message information while a message is being recorded or played. The remaining rows of ARAM 24 are used for storing message data.

ARAM 24 according to the present invention uses only four bits, that is, one nibble, of each ARAM 24 word of each of these four "no defect" rows. For example, let the first four "no-defect" rows be rows 0 through 3. Each byte in rows 0 and 1, that is, two nibbles extracted from two words, corresponds to and describes the status of a different row in the remainder of ARAM 24, that is, in rows 5 through 1023. The first byte extracted corresponds to and describes the status of row 0, the second byte extracted corresponds to and describes the status of row 1, and so on to the 1024th byte extracted which corresponds to and describes the status of row 1023.

Figure 2:
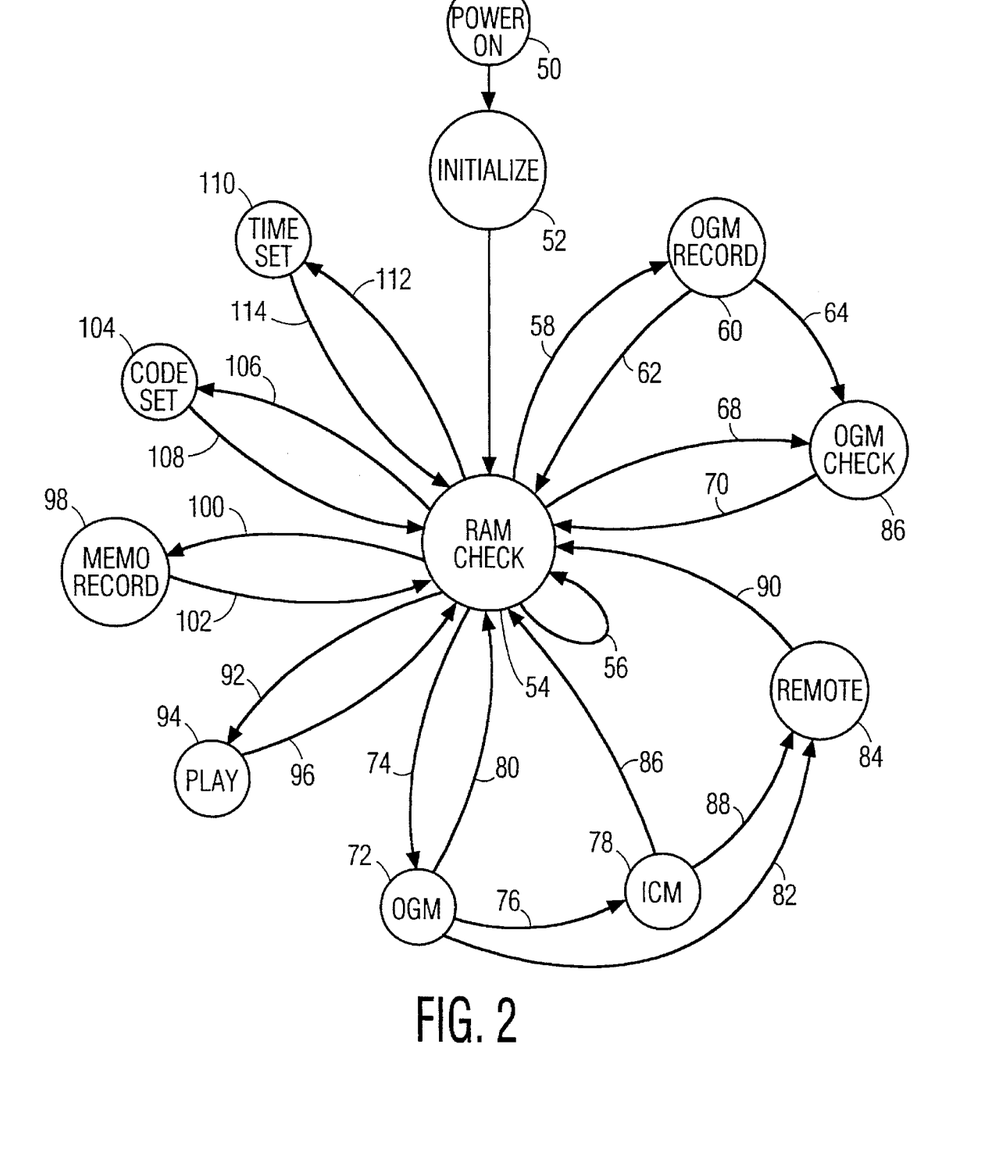
FIG. 2 is a state diagram showing the operating procedure for the telephone answering device.

FIG. 2 is a state diagram for the system of the present invention. When power is initially applied to the system (state 50), a hardware reset is generated and both the hardware and the software start from a known state. The software begins execution in the INITIALIZE state 52. Here, the registers, memory, and ports of DSP/controller 12 are set to initial values and general system housekeeping is set up. This housekeeping includes but is not limited to the initialization of ARAM 24 by determining its size and creating a directory. A quick check of sufficient memory to record a normal outgoing message (OGM) is also performed in the INITIALIZE state 52. Specifically, the quick check will be completed by the time a user presses an OGM key to begin recording the OGM, typically in the order of milliseconds, but no more than 2 to 4 seconds after power up.

The RAM CHECK state 54 is entered upon completion of the initialization process. Here, ARAM 24 is tested continuously while looking for events to take place. These events include but are not limited to internal or external interrupt requests, user key closures, and ring detection. When an event is detected, the current RAM check is completed, the event is decoded and the corresponding state is entered, as denoted by vector 56.

An OGM record key press, as denoted by vector 58, causes the OGM RECORD state 60 to be entered. If a memory error event occurs, control is passed back to RAM CHECK state 54, as denoted by vector 62. Normally, the outgoing message recording process is ended with another OGM record key press or a timer expired interrupt, as denoted by vector 64, changing the state to an OGM CHECK 66. OGM CHECK state 66 can also be entered from RAM CHECK state 54, as denoted by vector 68, by pressing the OGM check key. The end of a greeting playback event or a second OGM check key press will return the control back to the RAM CHECK state 54, as denoted by vector 70.

The OGM state 72 is entered and the outgoing message is broadcast to the line when an answer call event, denoted by vector 74, occurs. The answer call event 74 is generated when the number of rings equals a user selectable preset number. The end of a greeting playback event, denoted by vector 76, will cause the incoming message (ICM) state 78 to be entered. If an announce only mode has been selected, the greeting playback event will return control back to the RAM CHECK state 54, as denoted by vector 80. A remote code event, as denoted by vector 82, is generated when dual tone multi-frequency (DTMF) signals are received in the proper sequence and decoded to match a user selectable preset three digit number. A remote code event 82 during the OGM state 72 causes the REMOTE state 84 to be entered.

Messages are recorded from the line in the ICM state 78. A VOX event whereby no voice has been detected for a pre-determined period of time, or a time-out event, both events denoted by vector 86, will cause termination of the ICM state 78 and control will be passed back to the RAM CHECK state 54. A remote code event, as denoted by vector 88, during the ICM state 78 will cause the REMOTE state 84 to be entered.

In the REMOTE state 84, a caller can control certain functions of the machine from a remote location. Some of these functions include but are not limited to message playback, message save or erase, memo record, and greeting record. Absence of remote activity (valid DTMF signals) will cause a timer expiration event, as denoted by vector 90, to occur, returning control to the RAM CHECK state 54.

A play key press, denoted by vector 92, causes the PLAY state 94 to be entered. Messages are played back to a local user in the PLAY state 94. When the messages are finished playing, some time is provided for the user to replay, save or erase one or more of the messages. At the end of this period, a timer expiration event, as denoted by vector 96, causes control to be passed back to the RAM CHECK state 54.

To record a message locally, the MEMO RECORD state 98 is used. It is entered from the RAM CHECK state 54 when a memo record key press event occurs, as denoted by vector 100. A memo record key press event or a time-out event, as denoted by vector 102, will cause termination, and control will be passed back to the RAM CHECK state 54.

To set the remote code, the CODE SET state 104 is used. It is entered from the RAM CHECK state 54 when a code set key press event occurs, as denoted by vector 106. A code set key press event or a time-out event, as denoted by vector 108, will cause termination, and control will be passed back to the RAM CHECK state 54.

Similarly, to set the current time on the clock, the TIME SET state 110 is used. It is entered from the RAM CHECK state 54 when a time set key press event occurs, as denoted by vector 112. A time set key press event or a time-out event, as denoted by vector 114, will cause termination, and control will be passed back to the RAM CHECK state 54.

Figure 3A:
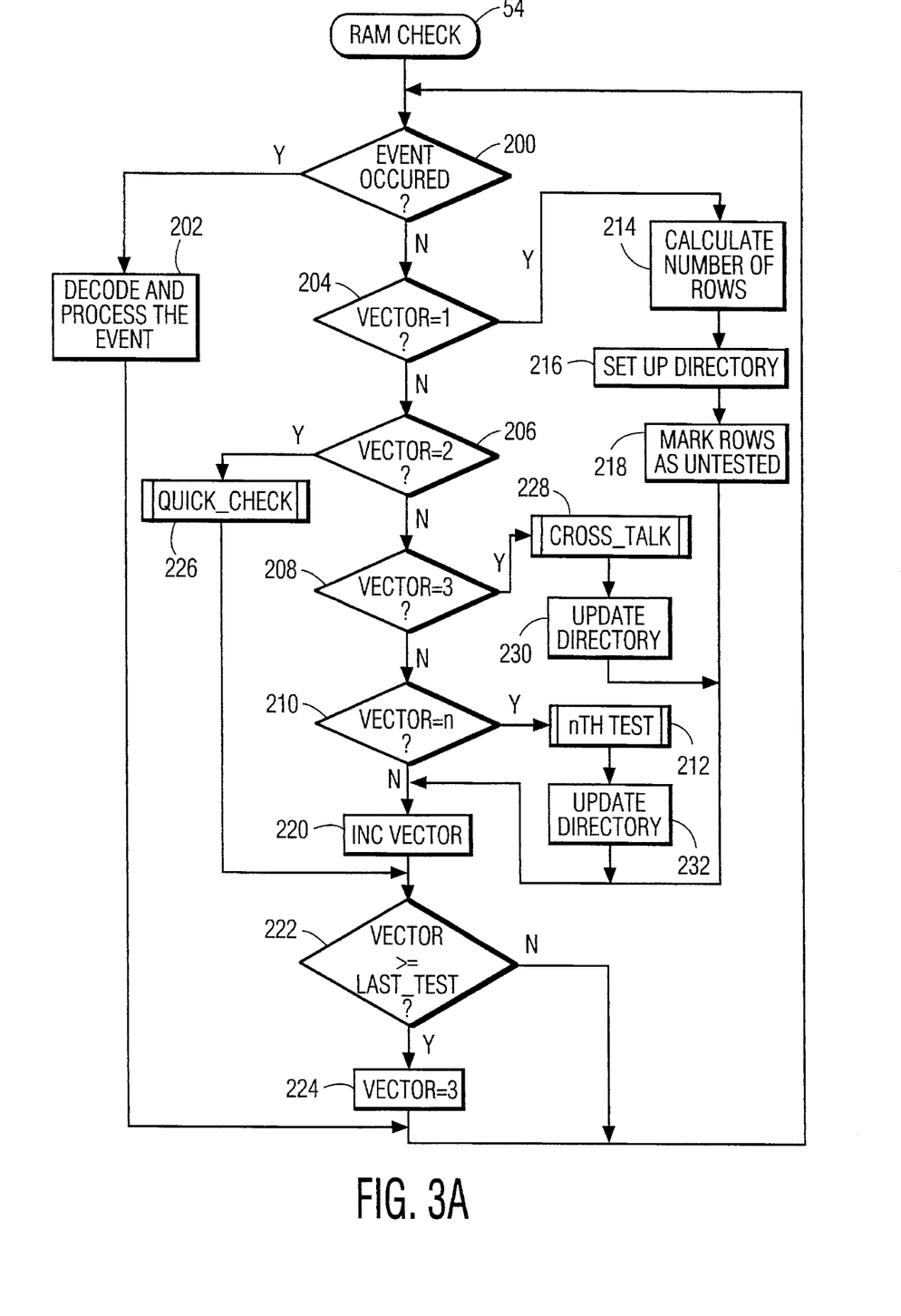
FIG. 3A is a flow diagram showing the continuous RAM testing procedure that runs during the TAD's idle time.

In the following descriptions of FIGS. 3A and 3B, it is assumed that the variables "ROW" and "VECTOR" are initialized to 0 and 1, respectively, in the INITIALIZE state 52 (FIG. 2). FIG. 3A shows a flowchart for the algorithm that is used in the present invention to continuously test ARAM 24 for bit errors or defects during its idle time. This algorithm is performed in RAM CHECK state 54 of FIG. 2. RAM CHECK state 54 is entered immediately after the system is initialized in INITIALIZE state 52 in FIG. 2. When an event occurs, such as a ring, key closure, or internal timer expiration, the RAM CHECK routine 54 is interrupted and the event is decoded and processed. When all events have been decoded and all tasks related to the event have been processed, the system returns to the idle state and testing of ARAM 24 is resumed.

The RAM CHECK routine 54 in its simplest form is an infinite loop that performs various tests on ARAM 24 while looking for an event to occur. If an event occurs (yes in step 200), it is decoded and processed (step 202). If there are no pending events (no in step 200), the next test vector is performed on ARAM 24 (step 204). As shown in FIG. 3A, the RAM CHECK routine 54 is broken into several test vectors (steps 204–210). This allows the designer to implement his own specific series of tests, which may be simple or complex, without affecting the structure of the routine. Each vector is written in such a way that a test is performed incrementally and in such a way that it could take anywhere from 1 to an infinite number of passes to complete the test. Each vector is also written in such a way that one pass will be completed in a time short enough to be transparent to the user. When the current vector is finished, a vector pointer is incremented (step 220) so that the next vector will be executed on the next pass.

The first test vector (VECTOR=1) (step 204) determines the size of ARAM 24 and sets up the directory (steps 214–216). Specifically, the number of rows are calculated (step 214), the directory is set up (step 216) and the untested rows are marked (step 218). The second test vector (VECTOR=2) (step 206) is used to quickly test a portion of ARAM 24 which is sufficiently large to store an outgoing message of a designer specified length, that is to perform a QUICK_CHECK operation (step 226), which is shown in more detail in FIG. 3B. In the present invention, this vector is a simple read/write pattern test that is complete when there is sufficient good memory to store a one minute outgoing message. The third test vector (VECTOR=3) (step 208) is a more comprehensive test that looks for cross-talk between memory locations (step 228) and then updates the directory (step 230). The fourth through the last test vectors (VECTOR=4 through VECTOR=LAST_TEST) (step 210) allow the designer to implement his own specific test procedures (step 212), and then the directory is updated (step 232). For example, if VECTOR=4, the fourth test will be run. After the variable VECTOR is incremented (step 220), it is compared to a constant LAST_TEST (step 222), and if it is greater than or equal to LAST_TEST, VECTOR is reset back to 3 (step 224). The third through the last test vectors (steps 208–210) are run continuously during idle time for as long as the machine is powered. The directory is updated after each pass of these vectors (steps 230 and 232).

Figure 3B:
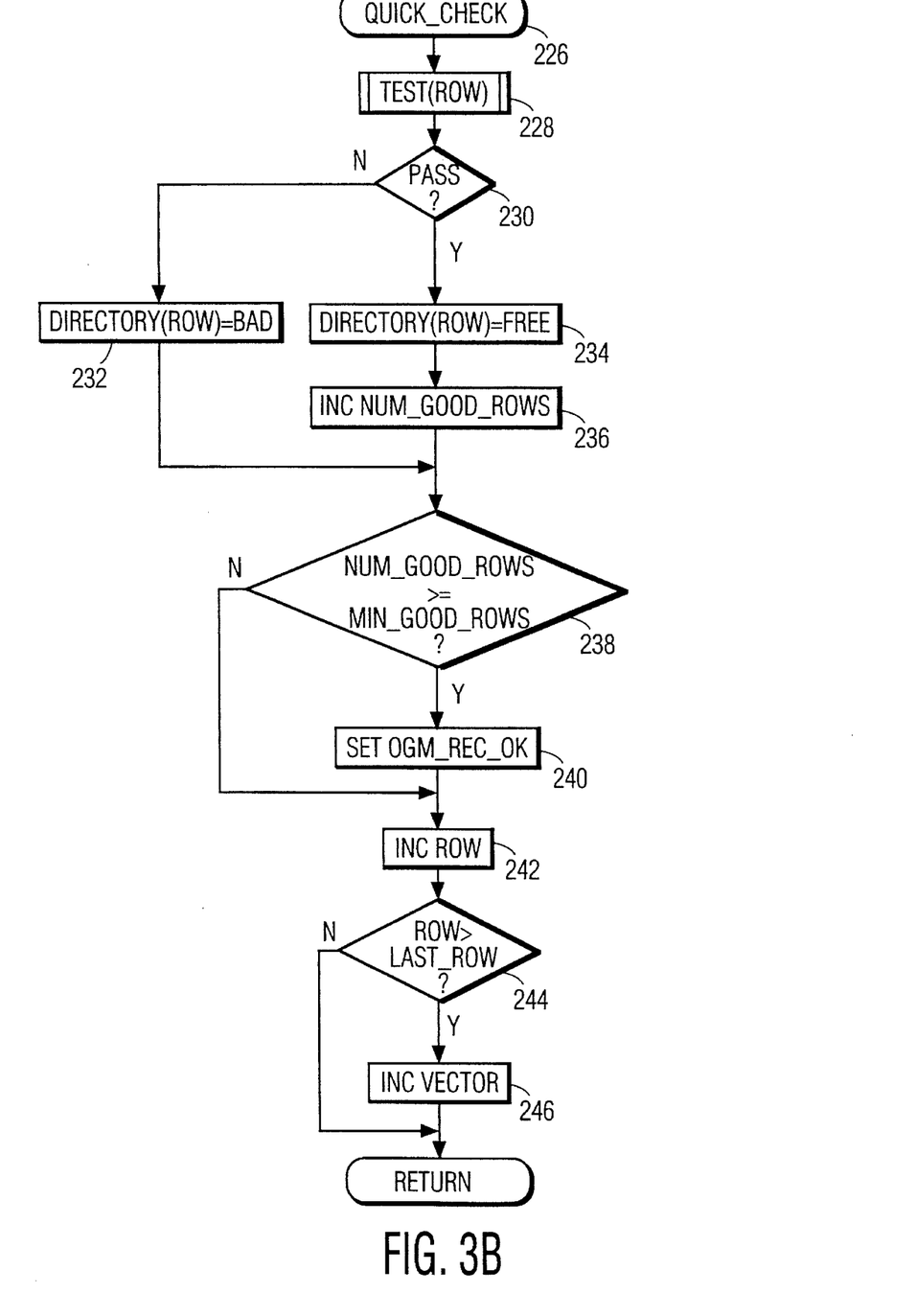
FIG. 3B is a flow diagram showing the abbreviated RAM testing procedure ("quick check") that runs following initial power up of the TAD.

FIG. 3B shows the flow chart of the quick check algorithm (step 226). In the present invention, several patterns are written to ARAM 24, one row at a time, read back and then compared to what was written (step 228). It is then determined if the row passes or fails a test (step 230). Specifically, if a row contains more than 5% errors, it is marked as bad (step 232). Otherwise, the row is marked as free or good (step 234), and a good row counter (NUM_GOOD_ROWS) is incremented (step 236). When the good row counter is greater than the minimum number of good (rows needed to record a one minute OGM (MIN_GOOD_ROWS) (step 238) the OGM_REC_OK flag is set (step 240). Next, the ROW variable is incremented 242, and ROW is compared to LAST_ROW (step 244). If ROW is greater than or equal to LAST_ROW, the variable VECTOR is also incremented (step 246), allowing the RAM CHECK routine 54 to proceed to the third vector (208 in FIG. 3A).

In the present invention, one row stores approximately 0.5 seconds of speech data. Therefore 120 good rows are necessary to record a one minute OGM. If the quick check algorithm requires 30 ms to test one row and the device has 10% bad rows, it will take approximately 4 seconds to complete the quick check. In this worst case, the telephone answering machine will be ready to use in one-eighth the time of a current TAD that tests the entire ARAM 24 at initialization. The remaining rows will be scanned and marked in the background during idle time.

Figure 3C:
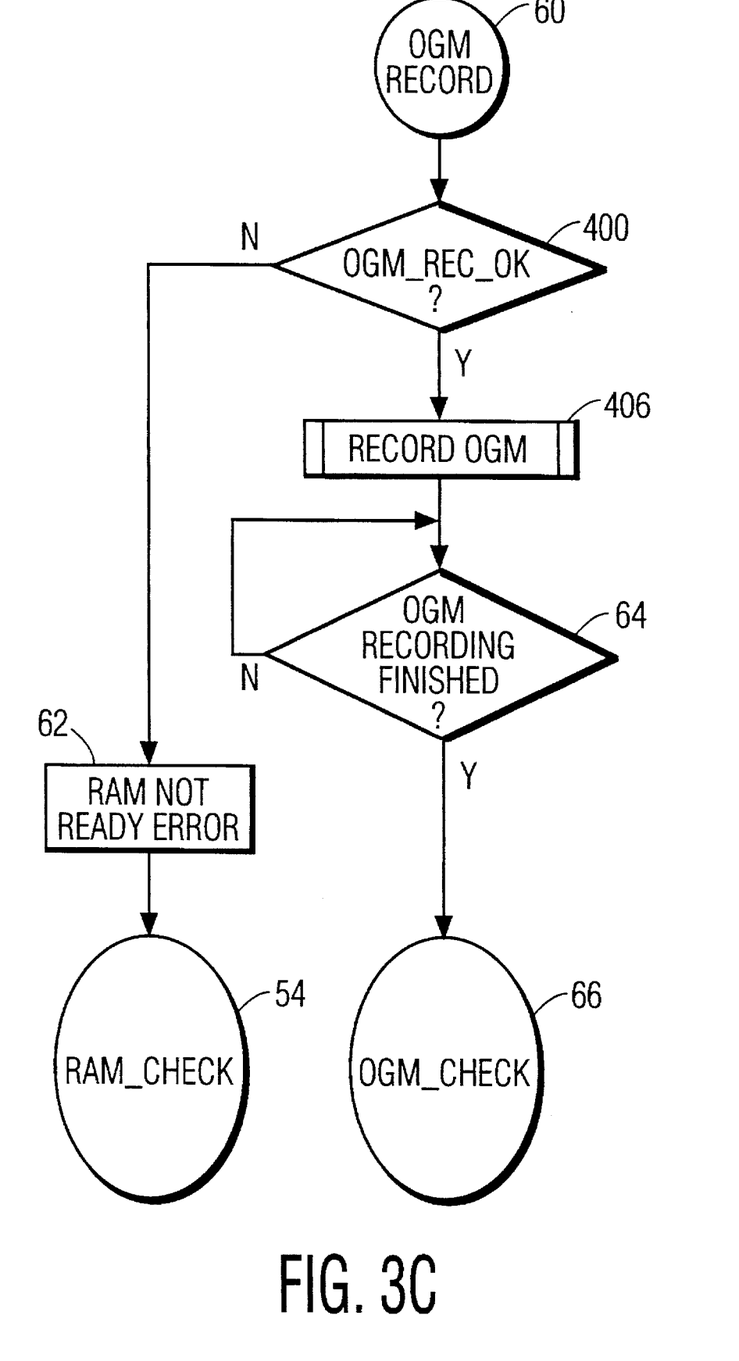
FIG. 3C is a flow diagram showing the outgoing message (OGM) recording procedure of the TAD.

FIG. 3C shows a flow chart of the outgoing message algorithm 60. If the OGM_REC_OK flag (step 400) is not set, a memory error event 62 immediately returns control back to the RAM CHECK state 54. If the OGM_REC_OK flag (step 400) is set, OGM recording begins (step 406). The outgoing message recording process is ended with another OGM record key press or a timer expired interrupt 64, changing the state to OGM CHECK 66.

Having described a specific preferred embodiment of the invention with reference to the accompanying drawings, it will be appreciated that the present invention is not limited to that specific embodiment, and that various modifications can be effected thereto by one of ordinary skill in the art without departing from the scope or spirit of the invention, as defined in the appended claims.

What is claimed is:

1. A method for testing a storage memory in a digital telephone answering device, the method comprising the steps of:

performing an initial test of only a predetermined portion of said memory, said predetermined portion of said memory having a size sufficient to store a first user input of information required to perform a basic telephone answering device function, said initial test being performed immediately after power is supplied to said device, without testing a remainder of said memory;

thereafter performing a continuous repetitive series of tests of at least said remainder of said memory while waiting for subsequent user inputs of information relating to any telephone answering device function, said continuous repetitive series of tests being performed to identify failed sections of said memory;

marking said identified failed sections of said memory;

processing said subsequent user inputs when such subsequent user inputs occur;

stopping performance of said continuous repetitive series of tests simultaneously with said processing of said subsequent user inputs; and returning to said step of performing said continuous repetitive series of tests after completion of said processing of said subsequent user inputs.

2. The method of claim 1, wherein said predetermined portion of said memory tested by said initial test is sufficient to store an outgoing message.

3. The method of claim 1, further comprising the step of processing a plurality of first user inputs of information required to perform basic telephone answering device functions during said performance of said initial test of only said predetermined portion of said memory.

4. The method of claim 3, further comprising the step of disabling recording of an outgoing message during said performance of said initial test of only said predetermined portion of said memory.

5. The method of claim 1, further comprising the step of recording an incoming message in a portion of said memory other than said identified failed sections of said memory.

6. A telephone answering device comprising:

digital recording and playback means for digitizing, recording and playing back a message from a telephone line;

memory means for storing messages digitized by said digital recording and playback means; and control means, coupled to said memory means, for:

performing an initial test of only a portion of said memory means, said predetermined portion of said memory means having a size sufficient to store a user input of information required to perform a basic telephone answering device function, said initial test being performed immediately after power is supplied to said device, without testing a remainder of said memory means, thereafter performing a continuous repetitive series of tests of at least said remainder of said memory means while waiting for subsequent user inputs of information relating to any telephone answering device function, said continuous repetitive series of tests being performed to identify failed sections of said memory means, marking said identified failed sections of said memory means, processing said subsequent user inputs when such subsequent user inputs occur;

stopping performance of said continuous repetitive series of tests simultaneously with said processing of said subsequent user inputs; and returning to said step of performing said continuous repetitive series of tests after completion of said processing of said subsequent user inputs.

7. The telephone answering device of claim 6, wherein said predetermined portion of said memory means tested by said initial test performed by said control means is sufficient to store an outgoing message.

8. The telephone answering device of claim 6, wherein said control means processes a plurality of first user inputs of information required to perform basic telephone answering device functions during said performance of said initial test of said predetermined portion of said memory means.

9. The telephone answering device of claim 8, wherein said control means disables recording of an outgoing message during said performance of said initial test of said predetermined portion of said memory means.

10. The telephone answering device of claim 6, wherein said memory means includes an audio random access memory means, and said control means includes a digital signal processor/controller coupled to said audio random access memory means.

11. The telephone answering device of claim 6, wherein said control means enables recording an incoming message in a portion of said memory other than said identified failed sections of said memory.

* * * * *